April 20, 1954 A. D. SCARBROUGH 2,676,251

BISTABLE BLOCKING OSCILLATOR

Filed Dec. 1, 1950

INVENTOR.
ALFRED D. SCARBROUGH.
BY Nicholas T Volsk
atty

Patented Apr. 20, 1954

2,676,251

UNITED STATES PATENT OFFICE 2,676,251

BISTABLE BLOCKING OSCILLATOR

Alfred D. Scarbrough, Los Angeles, Calif., assignor to Hughes Tool Company, Houston, Tex., a corporation of Delaware Application December 1, 1950, Serial No. 198,703

8 Claims. (Cl. 250—27)

The present invention relates to a bistable blocking oscillator, and more particularly to a bistable blocking oscillator whose oscillations may be started and stopped by gating pulses.

In conventional blocking oscillator circuits the oscillator bias is adjusted so that the circuit will not oscillate in the absence of synchronizing pulses, but is so near the oscillating position that the synchronizing pulses cause the circuit to perform a single oscillatory cycle following each synchronizing pulse. One method of starting and stopping the oscillations is to insert a gating circuit and associated control circuitry in the lead supplying synchronizing pulses so that these pulses may be turned on or off at will. This method of performing the control function requires a plurality of tubes and many other components.

The present invention proposes to overcome these difficulties by employing a single tube which performs both the oscillating and gating functions. The tube operates as a bistable blocking oscillator, that is, an oscillator having two degrees of stability. Once the oscillator is triggered by a positive controlling pulse, the oscillations will continue until the application of a negative controlling pulse.

According to the present invention, a positive bias is obtained by rectification of a portion of the output of the oscillator during this oscillatory cycle, and this bias is applied to the grid of the oscillator in order to maintain the oscillations after the removal of the positive pulse. In this manner, the oscillations will continue until the application of the negative pulse to the grid of the oscillator which effectively cancels the positive bias produced by rectification. It is thus seen that the blocking oscillator of the present invention performs a series of oscillations, this series being started by a positive pulse and stopped by a negative pulse.

An object of the present invention is the provision of a bistable blocking oscillator which is started by impressing a positive pulse thereon and stopped by impressing a negative pulse thereon.

A further object of the present invention is the provision of a bistable blocking oscillator which requires a low average current.

Still another object is to provide a bistable blocking oscillator which employs a single electron discharge tube for performing both the oscillatory and gating functions.

The novel features which are believed to be characteristic of the invention, both as to its organization and method of operation, together with further objects and advantages thereof, will be better understood from the following description considered in connection with the accompanying drawings in which several embodiments of the invention are illustrated by way of examples. It is to be expressly understood, however, that the drawings are for the purpose of illustration and description only, and are not intended as a definition of the limits of the invention.

Figure 1:
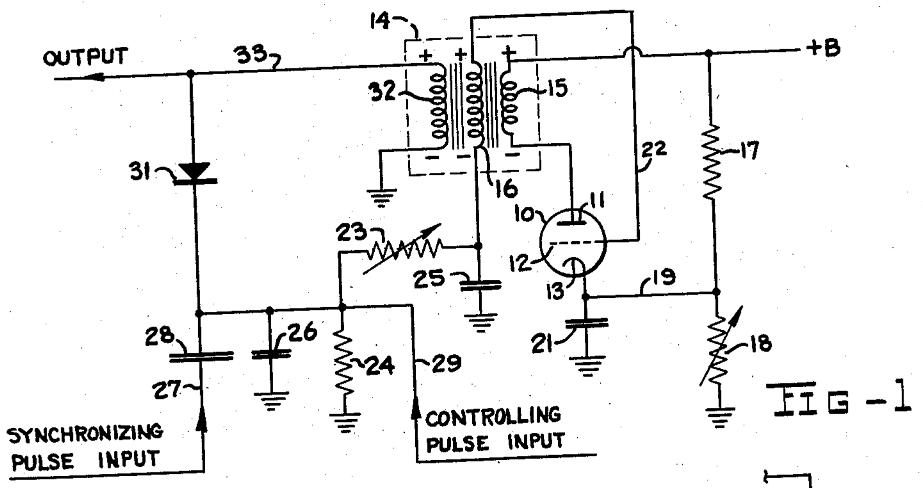
Fig. 1 is a circuit diagram of one form of the present invention.

Referring now to the drawings, wherein like reference characters designate like or corresponding parts throughout the several views, there is shown in Fig. 1, which illustrates a preferred embodiment of the invention, an electron discharge device such as a vacuum tube 10 having an anode 11, a control grid or electrode 12, and a cathode 13. A transformer 14 having a primary winding 15 and a secondary winding 16 provides inductive coupling between the anode 11 and grid 12. Windings 15 and 16 are connected in the anode potential supply circuit and the grid input circuit, respectively, with the polarity as shown in order to feed energy from the anode circuit back into the grid circuit. It is thus seen that tube 10 in conjunction with transformer 14 forms a conventional blocking oscillator.

Primary winding 15 of transformer 14 is connected between anode 11 and the positive terminal of a direct current power supply, not designated, the other terminal of the power supply being grounded. A pair of series connected resistors 17 and 18 are connected across the power supply, the junction point of resistors 17 and 18 being connected to cathode 13 by means of conductor 19. Resistors 17 and 18 constitute a voltage divider for biasing cathode 13 positive with respect to ground, and therefore, with respect to grid 12 as set forth below. Resistor 18 preferably is made variable to permit initial adjustment of the positive bias normally impressed on cathode 13 when the blocking oscillator is in a quiet condition. A by-pass capacitor 21 is connected across resistor 18 to maintain the potential of cathode 13 at its proper level when the tube is rendered conductive, capacitor 21 being sufficiently large to keep the cathode potential constant during the oscillatory cycle of the oscillator.

Secondary winding 16 of transformer 14 has one end thereof connected to grid 12 by means of a conductor 22, the other end of winding 16 being connected to ground through a variable resistor 23 and a fixed resistor 24. It is thus seen that maintaining cathode 13 positive with respect to ground, by means of resistance-condenser combination 18—21, provides a normally negative grid bias since grid 12 normally is kept at ground potential by being connected directly to ground through secondary winding 16 and resistors 23 and 24. A by-pass capacitor 25 is connected between resistor 23 and ground to form a low impedance path during the oscillation period of tube 10.

Figure 2:
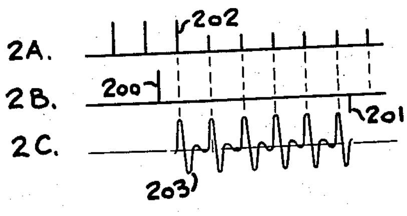
Fig. 2 is a diagram illustrating the input and output waveforms of the embodiment of Fig. 1.

A storage capacitor 26 has its upper plate connected to grid 12 through resistor 23, winding 16 and conductor 22, the lower plate of capacitor 26 being grounded. This connection, together with resistor 13, places capacitor 26 across the cathode grid circuit of tube 10, thereby enabling capacitor 26 to apply a bias to grid 12. Synchronizing pulses 202, Fig. 2, are applied to capacitor 26 to charge the same by means of a conductor 27 and a coupling capacitor 28. Controlling pulses 200, 201 are also applied to capacitor 26 by means of conductor 29.

In operation of the circuit thus far described, variable resistor 18 is adjusted so that the bias applied to grid 12 is sufficient to prevent oscillations even in the presence of synchronizing pulses 202. However, upon application of positive controlling pulse 200, capacitor 26 is charged to a higher positive level, with the result that the following synchronizing pulse 202 is of sufficient magnitude to overcome the bias impressed on grid 12 and trigger the oscillator tube 10.

Under these conditions, in the absence of an additional positive controlling pulse, oscillator tube 10 would perform a single oscillatory cycle 203, since grid 12 normally is biased sufficiently negative to prevent any repetition of the oscillations. However, according to the present invention, additional biasing means is derived from the output of oscillator tube 10 and this biasing means is applied to grid 12 to maintain the oscillations in the absence of a negative controlling pulse 201.

According to the preferred embodiment of the present invention, this self-biasing of tube 10 is achieved by the provision of a unidirectional device, such as a rectifier 31, having one end thereof connected to an auxiliary winding 32 of transformer 14 by means of conductor 33. Winding 32 also acts as the output circuit of tube 10. The other end of rectifier 31 is connected to the upper plate of capacitor 26, so that positive pulses appearing at winding 32 charge capacitor 26. The charging of capacitor 26 by means of rectifier 31 during the oscillatory cycle of tube 10 serves to maintain the potential at grid 12 sufficiently high so that the following synchronizing pulse 202 will trigger tube 10.

It is thus seen that the oscillations, once having been initiated by positive pulse 200 and the following synchronizing pulse 202, will continue due to the additional biasing provided by rectifier 31. The oscillations will cease only upon the application of a negative controlling pulse 201, which neutralizes at least a portion of the positive charge on capacitor 26, and thereby renders grid 12 sufficiently negative so as to prevent further oscillations. In this manner, the circuit of the present invention provides a blocking oscillator for producing a series of oscillations which are started by a positive pulse and stopped by a negative pulse.

Although the circuit described depends upon the application of synchronizing pulses, it is apparent that it will operate without these pulses in a manner equivalent to a free running blocking oscillator. Thus, by proper adjustment of the circuit time constants and the bias on tube 10, oscillations will be initiated by positive pulse 200 and maintained by the bias from rectifier 31, until the application of negative pulse 201.

Figure 3:
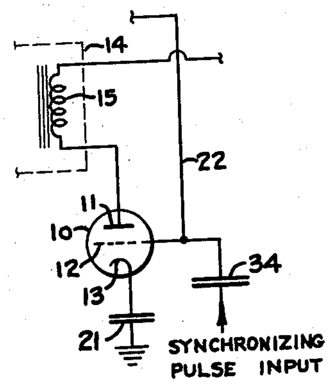
Figs. 3 to 5 are circuit diagrams illustrating modifications of the synchronizing pulse input circuit of Fig. 1.
Figure 5:
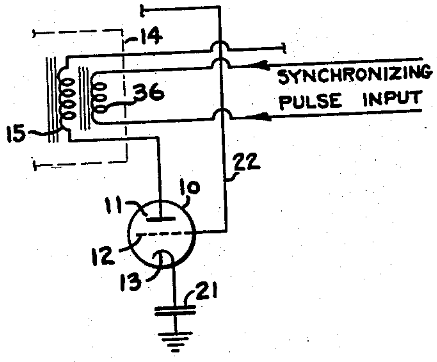
Figure 4:
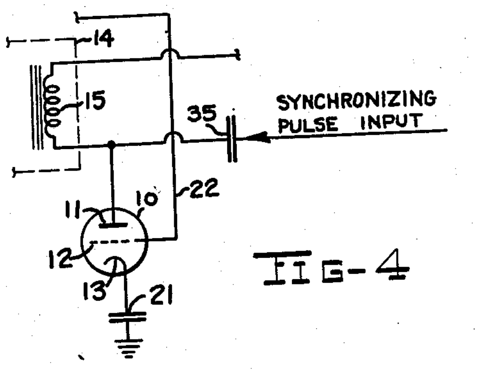

While only a preferred embodiment of the present invention has been described, it is clear that the disclosed circuit is capable of numerous modifications without departing from the spirit and scope of the invention. Thus, synchronizing pulses 202 may be impressed directly on grid 12 by means of a conventional coupling capacitor 34, as shown in Fig. 3; or they may be impressed upon anode 11 by any suitable coupling capacitor 35, as shown in Fig. 4. It is also apparent that pulses 202 may be impressed on both anode 11 and grid 12 by means of an additional transformer winding 36 coupled to winding 15, as shown in Fig. 5. Similarly, the biasing means may be obtained from portions of the circuit other than that described.

It is therefore to be understood that, within the scope of the appended claims, the invention may be practiced otherwise than as specifically described.

What is claimed is:

1. A blocking oscillator circuit for producing a series of oscillations which are started by a positive pulse and stopped by a negative pulse, said circuit comprising: an electron discharge device having a cathode, an anode, and a grid; a source of potential; means coupling said source between said anode and said cathode, said means including a first coil connected between said anode and said source; a second coil inductively coupled to said first coil and connected to said grid to feed back to said grid a portion of the voltage developed across said first coil; a capacitor coupled to said grid; means for applying synchronizing pulses to said capacitor; means for applying a positive pulse to said capacitor to increase the positive bias impressed on said grid to a level making said oscillator responsive to the synchronizing pulse following said positive pulse, said synchronizing pulse setting said oscillator into oscillations; a rectifier magnetically coupled to said first coil for rectifying a portion of the voltage developed thereacross; means for supplying the output of said rectifier to said grid to apply a positive bias thereto to maintain the oscillations produced by said synchronizing pulses in the absence of a negative pulse; and means for applying a negative pulse to said capacitor to stop the oscillations.

2. A blocking oscillator circuit for producing a series of oscillations which are started by a positive pulse and stopped by a negative pulse, said circuit comprising: an electron discharge device having an anode circuit and a control grid circuit; means coupling said anode circuit to said control grid circuit for feeding back to said control grid circuit a portion of the energy developed in said anode circuit; a storage capacitor coupled to said control grid circuit to apply a bias thereto; means for applying synchronizing pulses to said capacitor; means for applying positive and negative pulses to said capacitor, the positive pulse being sufficient to enable the following synchronizing pulse to initiate the oscillations; a rectifier electrically coupled to said anode circuit for rectifying a portion of the output thereof; and means for supplying the output of said rectifier to said control grid circuit to apply a positive bias thereto to maintain the oscillations in the presence of said synchronizing pulses and in the absence of the negative pulse.

3. A bistable blocking oscillator circuit comprising: an oscillator tube having an anode circuit and a control grid circuit; a storage capacitor coupled to said control grid circuit to apply a bias thereto; means for applying synchronizing pulses to said capacitor; means for applying positive and negative pulses to said capacitor, the positive pulse being sufficient to enable the following synchronizing pulse to initiate the oscillations; a rectifier electrically coupled to said anode circuit for rectifying a portion of the output thereof; and means for supplying the output of said rectifier to said control grid circuit to apply a positive bias thereto to maintain the oscillations in the presence of said synchronizing pulses and in the absence of the negative pulse.

4. A bistable blocking oscillator circuit comprising: an oscillator tube having an anode circuit and a control grid circuit; means for applying synchronizing pulses to said control grid circuit, said pulses being insufficient of themselves to initiate or maintain the oscillations of said tube; means for applying positive and negative pulses to said control grid circuit, the positive pulse being sufficient to enable the following synchronizing pulse to initiate the oscillations; a rectifier electrically coupled to said anode circuit for rectifying a portion of the output thereof; and means for supplying the output of said rectifier to said control grid circuit to apply a positive bias thereto to maintain the oscillations in the presence of said synchronizing pulses and in the absence of the negative pulse.

5. A bistable blocking oscillator circuit comprising: an oscillator tube having anode and control grid circuits; means for applying synchronizing pulses to said control grid circuit, said pulses being insufficient of themselves to initiate or maintain the oscillations of said tube; means for applying positive and negative pulses to said control grid circuit, the positive pulse being sufficient to enable the following synchronizing pulse to initiate the oscillations; means electrically coupled to said anode circuit for rectifying a portion of the output thereof; and means for supplying the output of said rectifying means to said control grid circuit to apply a positive bias thereto to maintain the oscillations in the presence of said synchronizing pulses and in the absence of the negative pulse.

6. A bistable blocking oscillator circuit comprising: an oscillator tube having anode and control grid circuits; means for applying synchronizing pulses to said control grid circuit, said pulses being insufficient of themselves to initiate or maintain the oscillations of said tube; means for applying positive and negative pulses to said control grid circuit, the positive pulse being sufficient to enable the following synchronizing pulse to initiate the oscillations; and means electrically coupled to said anode circuit and responsive to the amplitude of the signal developed therein for applying a positive bias to said control grid circuit to maintain the oscillations in the presence of said synchronizing pulses and in the absence of the negative pulse.

7. In a blocking oscillator circuit whose oscillations are initiated but not maintained by a positive pulse and which includes an oscillator tube having anode and control grid circuits, apparatus for maintaining the oscillations in the absence of a negative pulse, said apparatus comprising: a rectifier electrically coupled to said anode circuit for rectifying a portion of the output thereof; and means for supplying the output of said rectifier to said control grid circuit to apply a positive bias thereto sufficient to maintain the oscillations.

8. In a blocking oscillator circuit whose oscillations are initiated but not maintained by a positive pulse and which includes an oscillator tube having anode and control grid circuits, apparatus for maintaining the oscillations in the absence of a negative pulse, said apparatus comprising: means electrically coupled to said anode circuit for rectifying a portion of the output thereof; and means for supplying the output of said rectifying means to said control grid circuit to apply a positive bias thereto sufficient to maintain the oscillations.

References Cited in the file of this patent

UNITED STATES PATENTS

| Number | Name | Date |
|---|---|---|
| 2,292,835 | Hepp | Aug. 11, 1942 |
| 2,468,420 | Wendt | Apr. 26, 1949 |
| 2,562,925 | Lader | Aug. 7, 1951 |

FOREIGN PATENTS

| Number | Country | Date |
|---|---|---|
| 486,528 | Great Britain | June 3, 1938 |